(12) United States Patent
Tada et al.

(10) Patent No.: US 7,977,214 B2
(45) Date of Patent: Jul. 12, 2011

(54) METHOD OF MANUFACTURING FIELD-EFFECT TRANSISTOR, FIELD-EFFECT TRANSISTOR, AND METHOD OF MANUFACTURING DISPLAY DEVICE

(75) Inventors: Hiroshi Tada, Kanagawa (JP); Naoki Koito, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/782,710

(22) Filed: May 19, 2010

(65) Prior Publication Data

US 2010/0295038 A1 Nov. 25, 2010

(30) Foreign Application Priority Data

May 22, 2009 (JP) ................................. 2009-123833

(51) Int. Cl.
*H01L 21/00* (2006.01)
(52) U.S. Cl. ........................................................ 438/463
(58) Field of Classification Search .................. None
See application file for complete search history.

(56) References Cited

U.S. PATENT DOCUMENTS

2007/0077371 A1* 4/2007 Dimitrakopoulos et al. .. 428/1.1
2009/0001360 A1* 1/2009 Nakayama ....................... 257/40
2010/0117999 A1* 5/2010 Matsunaga et al. ........... 345/204

FOREIGN PATENT DOCUMENTS

JP 2008-166716 A 7/2008

OTHER PUBLICATIONS

Applied Physics Letters, 90,212114(2007).

* cited by examiner

*Primary Examiner* — Charles D Garber
*Assistant Examiner* — Andre' C Stevenson
(74) *Attorney, Agent, or Firm* — Solaris Intellectual Property Group, PLLC

(57) ABSTRACT

There is provided a method of manufacturing a top contact field-effect transistor including forming a protection layer on an active layer formed in a semiconductor layer forming process, forming a photoresist film on the protection layer and pattern exposing the same in an exposure process, and developing the photoresist film passing through the exposure process using an alkaline developing liquid to form a resist pattern and removing a region exposed by the resist pattern from the protection layer to etch the protection layer in a subsequent development process; a field-effect transistor, and a method of manufacturing a display device.

12 Claims, 4 Drawing Sheets

(A)

(B)

(C)

(D)

(A)

(B)

(C)

(D)

(E)

(F)

(G)

(H)

(I)

(J)

(K)

(L)

METHOD OF MANUFACTURING FIELD-EFFECT TRANSISTOR, FIELD-EFFECT TRANSISTOR, AND METHOD OF MANUFACTURING DISPLAY DEVICE

CROSS-REFERENCE TO RELATED APPLICATION

This application claims priority under 35 USC 119 from Japanese Patent Application No. 2009-123833, filed on May 22, 2009, the disclosure of which is incorporated by reference herein.

BACKGROUND OF THE INVENTION

1. Field of the Invention

The present invention relates to a method of manufacturing a field-effect transistor, a field-effect transistor, and a method of manufacturing a display device.

2. Description of the Related Art

In recent years, flat panel displays (FPD) have been put into practical use due to the progress of a liquid crystal technique, an electroluminescence (EL) technique, etc. In particular, since organic electroluminescence devices (hereinafter referred to as an "organic EL device") using thin film materials that are excited by the application of a current to emit light can obtain high-intensity luminescence at a low voltage, a reduction in the thickness, weight, dimension, and electricity consumption of the devices have been expected in a wide range of fields including cellular-phone displays, personal digital assistants (PDA), computer displays, information displays of automobiles, TV monitors, or common lighting. These FPDs are driven by an active matrix circuit of field-effect transistors (hereinafter sometimes referred to as TFT) in which an amorphous silicon thin film or a polycrystalline silicon thin film provided on a glass substrate is used for an active layer.

In contrast, it has been attempted to use a resin substrate that is lightweight and has flexibility in place of a glass substrate in order to achieve a further reduction in the thickness of the FPDs, a reduction in the weight thereof, and an improvement of breakage resistance thereof. However, the manufacturing of the transistors using a silicon thin film requires a relatively high-temperature heating process and is difficult to directly form on a resin substrate generally having low heat resistance. Then, the development of TFTs using an amorphous oxide semiconductor allowing film forming at low temperatures has been actively performed. The amorphous oxide semiconductor can form a film at room temperature and can be formed on a film, and thus has attracted attention as a material for the active layer in TFTs.

The amorphous oxide semiconductor is known to be susceptible to acid. Therefore, by providing an acid-resistant layer on the active layer, the active layer containing the amorphous oxide semiconductor is protected from an acid to be used in the manufacturing process for TFTs (e.g. Japanese Patent Application Laid-Open (JP-A) No. 2008-166716 and APPLIED PHYSICS LETTERS, 90, 212114 (2007)). The documents propose providing a layer containing $SiO_2$ on the active layer as a layer for protecting the active layer.

SUMMARY OF THE INVENTION

The present invention has been made in view of the above circumstances and provides a method of manufacturing a field-effect transistor, a field-effect transistor, and a method of manufacturing a display device.

A first aspect of the present invention provides a method of manufacturing a top contact field-effect transistor comprising a substrate, a gate electrode, a gate insulating film, an active layer comprising an oxide semiconductor as a main component, a protection layer, a source electrode, and a drain electrode, the method comprising: forming the protection layer on the active layer, forming a photoresist film on the protection layer, pattern exposing the photoresist film, and developing the photoresist film using an alkaline developing liquid to form a resist pattern, and removing a region exposed by the resist pattern from the protection layer.

A second aspect of the present invention provides a field-effect transistor manufactured according to the method of manufacturing the field-effect transistor according to the first aspect of the present invention.

A third aspect of the present invention provides a method of manufacturing a display device containing a field-effect transistor, in which the field-effect transistor is manufactured according to the method of manufacturing the field-effect transistor of the first aspect of the present invention.

Figure 2:
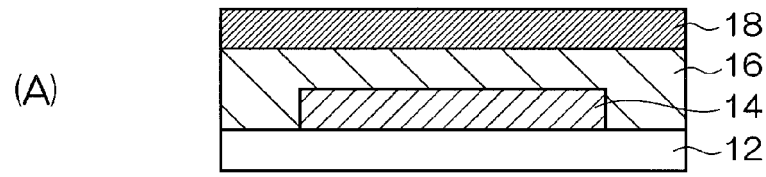
Figure 2:
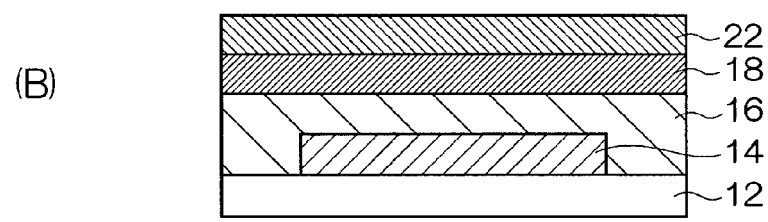
Figure 2:
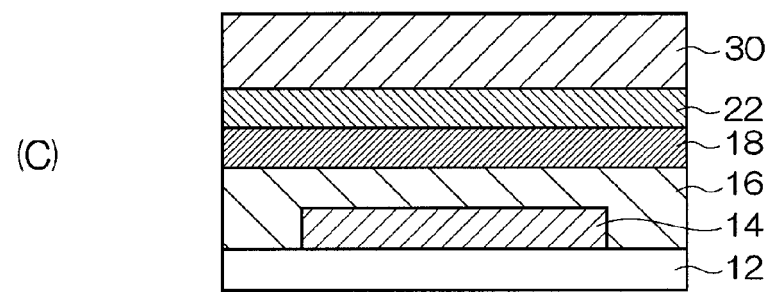
Figure 2:
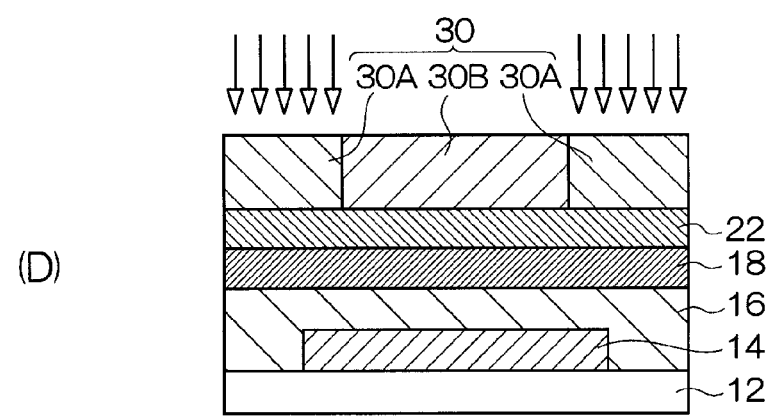

(A) to (D) of FIG. 2 are schematic views showing a manufacturing process for the field-effect transistor of this exemplary embodiment.

Figure 3:
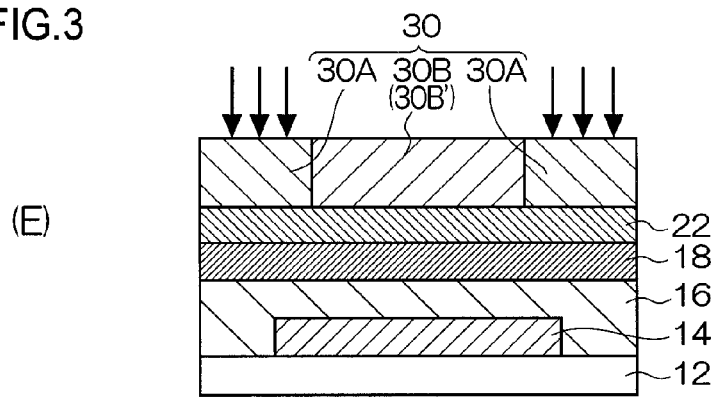
Figure 3:
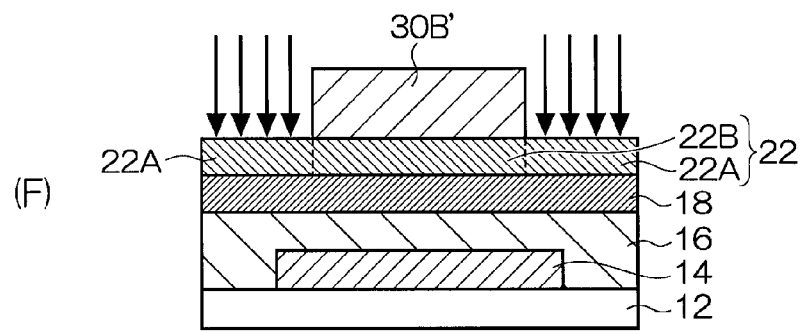
Figure 3:
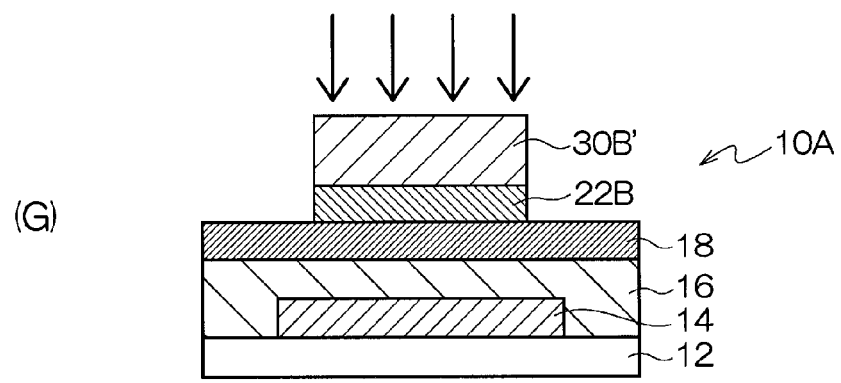
Figure 3:
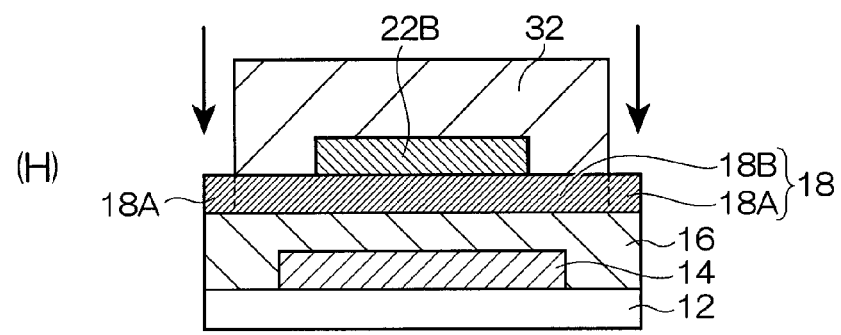

(E) to (H) of FIG. 3 are schematic views showing the manufacturing process for the field-effect transistor of this exemplary embodiment.

Figure 4:
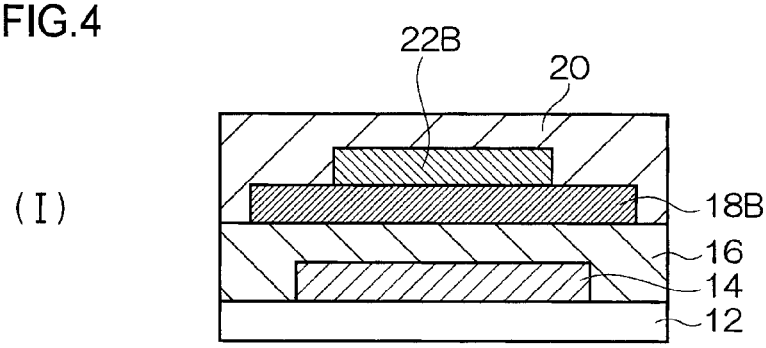
Figure 4:
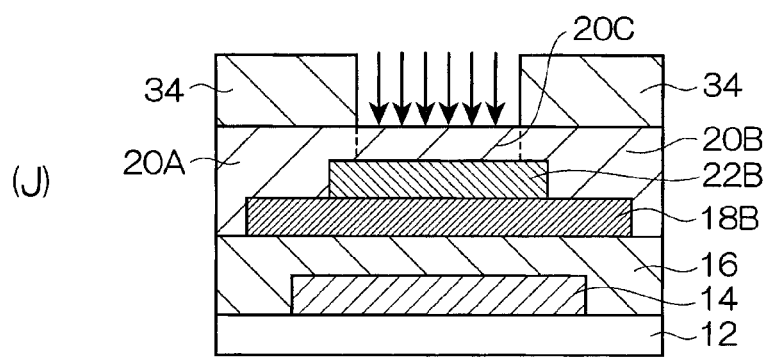
Figure 4:
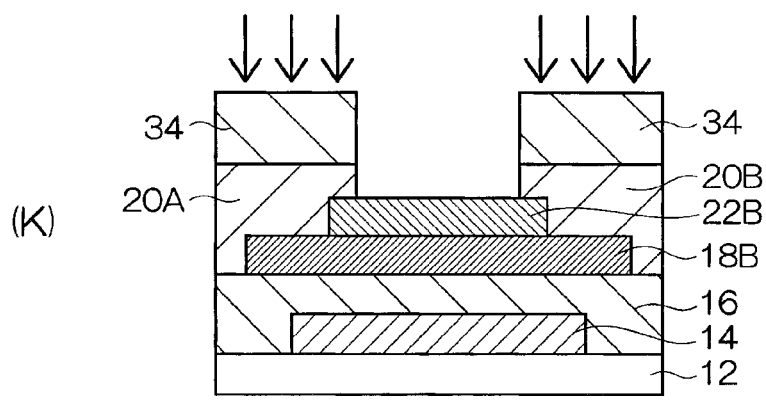
Figure 4:
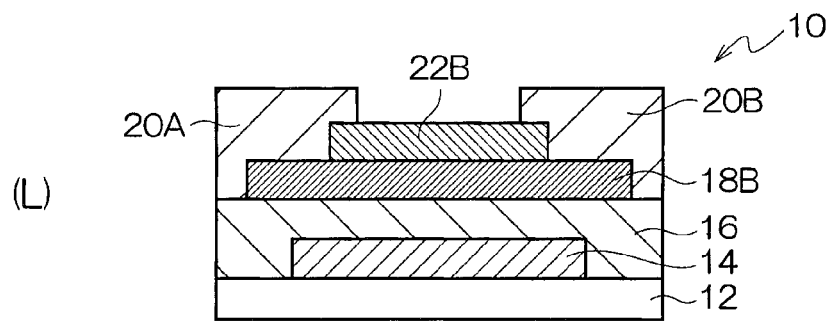

(I) to (L) of FIG. 4 are schematic views showing the manufacturing process for the field-effect transistor of this exemplary embodiment.

DETAILED DESCRIPTION OF THE INVENTION

A method of manufacturing a field-effect transistor of the present invention and a field-effect transistor manufactured by the method of manufacturing a field-effect transistor of the present invention will be described according to one exemplary embodiment with reference to the drawings.

Figure 1:
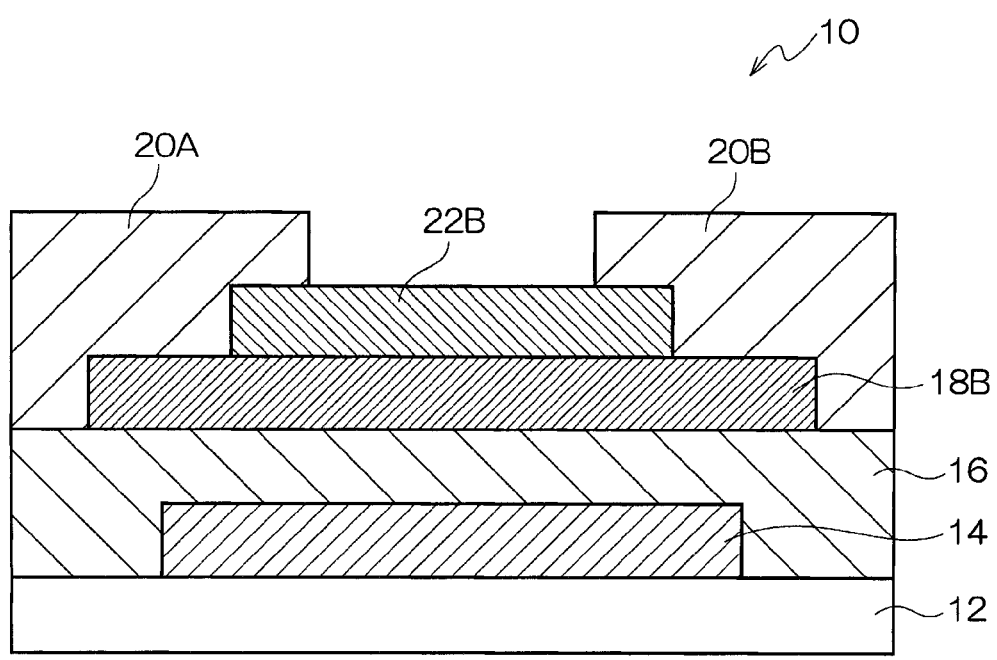
FIG. 1 is a schematic view showing a configuration of a field-effect transistor of this exemplary embodiment.

As shown in FIG. 1, a field-effect transistor 10 of this exemplary embodiment has a configuration in which at least a gate electrode 14, a gate insulating film 16, an active layer 18B, a protection layer 22B, and a source electrode 20A and a drain electrode 20B are successively laminated on a substrate 12. The active layer 18B functions as a channel layer through which electrons or holes moves.

The field-effect transistor 10 of this exemplary embodiment is configured into a top contact type in which the active layer 18B is in contact with the source electrode 20A and the drain electrode 20B on the upper surface side of the active layer 18B (surface side opposite to the substrate 12 of the active layer 18B).

The field-effect transistor 10 of this exemplary embodiment may be the top contact type and may be a bottom gate type or a top gate type.

The field-effect transistor 10 is an active device having a function of switching a current between the source electrode 20A and the drain electrode 20B by controlling a current flowing into the active layer 18B by the application of a voltage to the gate electrode 14.

Examples of materials constituting the substrate 12 include inorganic materials, such as glass or YSZ (zirconia stabilized yttrium) and organic materials: such as polyester, such as polyethylene terephthalate, polybutylene phthalate, or polyethylene naphthalate, polystyrene, polycarbonate, polyethersulfone, polyarylate, polyimide, polycycloolefin, norbornene resin, or poly(chlorotrifluoroethylene). When the organic materials are used as the materials constituting the substrate 12, it is preferable to select materials excellent in heat resistance, dimensional stability, solvent resistance, electrical insulation, processability, low permeability, or low hygroscopicity.

It is preferable for the substrate 12 to have flexibility. From the viewpoint of having flexibility, it is preferable to use organic plastic films obtained by forming the organic materials mentioned above into a film shape. When the insulation of the substrate 12 is insufficient, an insulating layer may be provided or a gas barrier layer for preventing permeation of moisture or oxygen or an undercoat layer for improving the flatness of a film-like plastic substrate or the adhesion with the electrode or the active layer may be further laminated on the substrate 12.

The thickness of the substrate 12 is preferably set to 50 µm to 500 µm. When the thickness of the substrate 12 is 50 µm or more, the substrate 12 itself can maintain sufficient flatness. When the thickness of the substrate 12 is 500 µm or lower, the substrate 12 itself can be freely bent, i.e., the flexibility of the substrate 12 itself becomes favorable.

Preferable examples of materials constituting the gate electrode 14 include metals, such as Al, Mo, Cr, Ta, Ti, Au, or Ag, alloys, such as Al—Nd or APC, conductive films of metal oxides, such as tin oxide, zinc oxide, indium oxide, indium tin oxide (ITO), or indium zinc oxide (IZO), organic conductive compounds, such as polyaniline, polythiophene, or polypyrrole, or mixtures and alloys thereof. The thickness of the gate electrode 14 is preferably set to 10 nm to 1000 nm.

Examples of the gate insulating film 16 include insulators, such as $SiO_2$, $SiN_x$, SiON, $Al_2O_3$, $Y_2O_3$, $Ta_2O_5$, or $HfO_2$ or mixed crystal compounds containing at least two compounds thereof. Moreover, polymer insulating materials, such as polyimide, are also used as the gate insulating film 16.

The film thickness of the gate insulating film 16 is preferably 10 nm to 10 µm. The gate insulating film 16 needs to increase the film thickness to some extent in order to reduce leakage current or increase voltage resistance. However, an increase in the film thickness of the gate insulating film 16 results in an increase in a driving voltage of the field-effect transistor 10. Therefore, the film thickness of the gate insulating film 16 is preferably 50 nm to 1000 nm when formed with inorganic insulators and is preferably 0.5 µm to 5 µm when formed with polymer insulating materials. In particular, when a high dielectric constant insulator, such as $HfO_2$, is used for the gate insulating film 16, the field-effect transistor 10 can be driven at a low voltage even when the film thickness is increased, which is particularly preferable.

The active layer 18B contains oxide semiconductors as a main component. The main component refers to a component whose content is the highest in the components contained in the active layer 18B and is preferably 50% or more. The oxide semiconductors can form a film at low temperatures, and thus is preferably formed on the substrate 12 having flexibility.

The oxide semiconductors to be used for the active layer 18B are preferably amorphous oxides containing at least one element selected from the group consisting of In, Zn, Ga, Sn, or Cd and more preferably amorphous oxides containing at least one member selected from the group consisting of In, Zn, and Ga.

Specific examples of the amorphous oxides to be used for the active layer 18B include one whose composition is represented by $InGaO_3(ZnO)_3$ (m is a natural number lower than 6), $ZnO \cdot Rh_2O_3$, $CuGaO_2$, or $SrCu_2O_2$ as a composition structure and the oxide semiconductor disclosed in JP-A No. 2006-165529.

Among the above, as the amorphous oxide semiconductor to be used for the active layer 18B, amorphous oxide semiconductors whose composition in a crystal state is represented by $InGaO_3(ZnO)_m$ (m is a natural number lower than 6) are preferably used. Furthermore, among the amorphous oxide semiconductors whose composition in a crystal state is represented by $InGaO_3(ZnO)_m$ (m is a natural number lower than 6), $InGaZnO_4$ is more preferable. The amorphous oxide semiconductors having the composition have a tendency that the electron mobility increases with an increase in the electrical conductivity.

The electrical conductivity of the active layer 18B is preferably $10^{-4}$ $Scm^{-1}$ or more and lower than $10^2 Scm^{-1}$ and more preferably $10^{-1}$ $Scm^{-1}$ or more and lower than $10^2 Scm^{-1}$. Examples of methods for adjusting the electrical conductivity of the active layer 18B include known adjustment methods by oxygen defects, composition ratios, impurities, or oxide semiconducting materials.

The protection layer 22B is a function layer having a function of protecting the active layer 18B from being eroded. In detail, in the manufacturing process for the field-effect transistor 10, the protection layer 22B has a function of suppressing erosion of the active layer 18B with various solution, such as an etching liquid, to be used in a process after forming the active layer 18B and, when and after constituted as the field-effect transistor 10, has a function of suppressing pollution of the active layer 18B by the open air.

As the protection layer 22B, materials having properties of both acid resistance and alkali solubility are used. Thus, the formed protection layer 22B has properties of both acid resistance and alkali solubility.

Here, the "acid resistance" required in the protection layer 22B indicates that the materials are difficult to dissolve at least in an acid etching liquid to be used for forming the source electrode 20A and the drain electrode 20B in the manufacturing process for the field-effect transistor 10 described later.

The difficulty in dissolving in the acid etching liquid indicates that the dissolution rate of the materials constituting the protection layer 22B in the acid etching liquid having a liquid temperature of 23° C. and containing 3% by mass of nitric acid, 73% by mass of phosphoric acid, 7% by mass of acetic acid, and 17% by mass of water is 2 nm/s or lower.

The "alkali solubility" required in the protection layer 22B refers to properties of dissolving in an alkaline developing liquid, i.e., alkali soluble, to be used for the development of a photoresist film 30 ((C) of FIG. 2), details will be described later) provided through the protection layer 22 (2(C) of FIG. 2) on the active layer 18 ((C) of FIG. 2), details will be described later) in the manufacturing process for the field-effect transistor 10 described later.

The alkali solubility in the alkaline developing liquid indicates that the dissolution rate of the materials constituting the protection layer 22B in an aqueous alkaline developing liquid having a liquid temperature of 23° C. and containing 2.38% by mass of tetramethyl ammonium hydroxide is 0.5 nm/s or more.

The materials constituting the protection layer 22B may be materials satisfying the properties described above, and specifically, $Ga_2O_3$ and the like as a Ga containing oxide are preferably used.

In addition to the properties described above, by constituting the protection layer 22B using the Ga containing oxide, a reduction in an ON/OFF ratio (current ratio of ON state and OFF state) of a source-drain current is suppressed compared with the case where $SiO_2$ is used as a layer for protecting the active layer as in former techniques. This is because it is considered that the use of the Ga containing oxide can reduce damages to the active layer during the film forming of the protection layer.

The materials constituting the protection layer 22B are preferably amorphous. When the materials constituting the protection layer 22B are amorphous, the alkali solubility becomes favorable.

The layer thickness of the protection layer 22B may be set such that the active layer 18B provided on the lower layer side is not exposed and that a channel layer function of the active layer 18B in the manufactured field-effect transistor 10 is not impaired, even when protection layer 22B is partially dissolved by the acid etching liquid used for forming the source electrode 20A and the drain electrode 20B in the manufacturing process for the field-effect transistor 10, which is described further below. Therefore, the layer thickness of the protection layer 22B varies depending on the type of the acid etching liquid or the type of the alkaline developing liquid to be used in the manufacturing process for the field-effect transistor 10 or the like, and on the configuration of the field-effect transistor 10 to be manufactured.

Specifically, the layer thickness of the protection layer 22B is preferably 20 nm to 500 nm and more preferably 30 nm to 100 nm.

When the layer thickness of the protection layer 22B is 20 nm or more, the protection layer 22B certainly functions as an etching stopper that prevents the acid etching liquid to be used in a source electrode and drain electrode forming process described later from reaching the active layer 18B. When the protection layer 22B is 500 nm or lower, the film forming time and the etching time of the protection layer 22 are reduced.

The resistivity of the protection layer 22B is preferably 100Ω·cm to 100 GΩ·cm and more preferably 1 kΩ·cm to 100 GΩ·cm.

When the resistivity of the protection layer 22B is within the range mentioned above, the insulation of the protection layer 22B to such an extent that the function as a channel layer for the active layer 18B is achieved.

For the measurement of the resistivity (electrical resistivity) of the protection layer 22B, a circular electrode having a first voltage application electrode and a second voltage application electrode is prepared. The first voltage application electrode has a cylindrical electrode portion and a cylindrical ring-shaped electrode portion having an inner diameter larger than the outer diameter of the cylindrical electrode portion and surrounding the cylindrical electrode portion at a fixed interval. Then, the protection layer 22B as a sample to be measured is inserted between the cylindrical electrode portion and the ring-shaped electrode portion in the first voltage application electrode and the second voltage application electrode, a current I (A) flowing 30 seconds after the application of a voltage V (V) between the cylindrical electrode portion in the first voltage application electrode and the second voltage application electrode is measured, and the electrical resistivity ρv (Ω·cm) can be determined by the following equation.

Equation: $\rho v = \pi d^2 / 4t \times (V/I)$

Here, in the equation above, d (cm) represents the outer diameter of the cylindrical electrode portion and t (cm) represents the film thickness of the protection layer 22B.

Preferable examples of the materials constituting the source electrode 20A and the drain electrode 20B include metals, such as Al, Mo, Cr, Ta, Ti, Au, or Ag, alloys, such as Al—Nd or APC, conductive films of metal oxides, such as tin oxide, zinc oxide, indium oxide, indium oxide tin (ITO), or zinc oxide indium (IZO), and organic conductive compounds, such as polyaniline, polythiophene, or polypyrrole, or mixtures and alloys thereof.

The total thickness of the source electrodes 20A to be formed and the total thickness of the drain electrodes 20B to be formed are preferably set to 10 nm to 1000 nm.

The field-effect transistor 10 of this exemplary embodiment is manufactured by passing through a semiconductor layer forming process, a protection layer forming process, a resist forming process, an exposure process, a development process, an active layer processing process, and a source electrode and drain electrode forming process. Hereinafter, the manufacturing method for the field-effect transistor 10 constituted by the materials mentioned above will be described in detail.

(1) Semiconductor Layer Forming Process

As shown in (A) of FIG. 2, the active layer 18 containing amorphous oxide semiconductors is formed first in a semiconductor layer forming process. Specifically, the gate electrode 14, the gate insulating film 16, and the active layer 18 are laminated in this order on the substrate 12. In the semiconductor layer forming process, the gate insulating film 16 and the active layer 18 may be laminated in this order after the gate electrode 14 is formed on the substrate 12 and patterned.

As methods for forming the gate electrode 14 and the gate insulating film 16 on the substrate 12, known methods are used and the methods are not particularly limited. For example, a method considering the suitability with the materials constituting each layer may be selected from wet methods, such as a printing method or a coating method, physical methods, such as a vacuum deposition method, a sputtering method, or an ion plating method, and chemical methods, such as a CVD method or a plasma CVD method.

For example, when ITO is selected as the materials constituting the gate electrode 14, a direct current or high frequency sputtering method, a vacuum deposition method, an ion plating method, or the like is selected as the method for forming the gate electrode 14. When organic conductivity compounds are selected as the materials constituting the gate electrode 14, a wet film forming method is selected.

When the active layer 18 to be formed on the gate insulating film 16 is patterned in a later process, the active layer 18 functions as the active layer 18B when constituted as the field-effect transistor 10.

As the method for forming the active layer 18, it is preferable to use vapor deposition methods using, as a target, polycrystalline sintered compacts of the amorphous oxide semiconductors constituting the active layer 18B. Among the vapor deposition methods, a sputtering method and a pulsed laser deposition method (PLD method) are suitable. From the viewpoint of mass production, a sputtering method is preferable. The active layer 18 is formed by an RF magnetron sputtering vapor deposition method while controlling the vacuum degree and the oxygen flow rate. When the method is used, the electrical conductivity of the formed active layer 18B can be made small when the oxygen flow rate is higher. The formed active layer 18 is confirmed to be an amorphous film by a well-known X-ray diffraction method. The film thickness of the active layer 18 is determined by probe-type surface-shape measurement. The composition ratio is determined by an RBS (Rutherford Backscattering Spectroscopy) analysis method.

(2) Protection Layer Forming Process

In a protection layer forming process, as shown in (B) of FIG. 2, the protection layer 22 is formed on the active layer 18 formed in the semiconductor layer forming process.

When the protection layer 22 is processed (etching) by the alkaline developing liquid in a development process described later, the protection layer 22 functions as the protection layer 22B when constituted as the field-effect transistor 10.

As the method for forming the protection layer 22, it is preferable to use a vapor deposition method using, as a target, polycrystalline sintered compacts of the materials constituting the protection layer 22B described above. Among the vapor deposition methods, a sputtering method and a pulsed laser deposition method (PLD method) are suitable. From the viewpoint of mass production, a sputtering method is preferable. It may be confirmed by a well-known X-ray diffraction method whether or not the formed protection layer 22 is amorphous. The film thickness of the protection layer 22 is determined by probe-type surface-shape measurement.

(3) Resist Forming Process

In a resist forming process, a photoresist film 30 is formed on the protection layer 22 formed in the protection layer forming process as shown in (C) of FIG. 2.

The photoresist film 30 is formed by applying a photoresist onto the protection layer 22. The photoresist may be a photoresist to be developed by the alkaline developing liquid to be used in a development process described later that is performed subsequent to the resist forming process. The photoresist may be a positive photoresist in which an exposed portion is removed by development or a negative photoresist in which a non-exposed portion is removed by development.

This exemplary embodiment describes an aspect of using the positive photoresist as one example.

As the photoresist, photosensitive resin compositions that are sensitive to radiation, such as ultraviolet rays (g rays, i rays), far ultraviolet rays including an excimer laser or the like, an electron beam, an ion beam, or X-rays.

Specifically, as the positive photoresist, compositions containing a quinone diazide compound and an alkali soluble resin are preferable. Positive photosensitive resin compositions containing a quinone diazide compound and an alkali soluble resin are used as the positive photoresist utilizing the fact that a quinone diazide group decomposes by irradiation with light having a wavelength of 500 nm or lower to generate a carboxy group, and as a result the state changes from an alkali insoluble state to an alkali soluble state. The photosensitive resin compositions have a remarkably excellent resolution, and thus are used for the production of integrated circuits, such as IC or LSI. Examples of the quinone diazide compound include a naphthoquinone diazide compound.

(4) Exposure Process

In an exposure process, a photomask is placed on the photoresist film 30 formed on the protection layer 22 in the photoresist forming process and pattern exposure is performed to expose the same in a pattern shape, and then a portion that is not irradiated with light is cured by additionally heating.

More specifically, by the exposure process, a region 30B that is not irradiated with light of the photoresist film 30 is cured and a region 30A that is irradiated with light of the photoresist film 30 is not-cured (alkali soluble state) as shown in (D) of FIG. 2.

Examples of the light to be used for the pattern exposure to the photoresist film 30 in this exposure process include light to which the photoresist film 30 is sensitive, such as the ultraviolet rays, far ultraviolet rays, an electron beam, ion beam, or radiation mentioned above.

(5) Development Process

In a development process, as shown in (E) of FIG. 3 and (F) of FIG. 3, the photoresist film 30 passing through the exposure process is developed using an alkaline developing liquid to form a resist pattern 30B' corresponding to the region 30B of the photoresist film 30 and a region 22A exposed from the resist pattern 30B' of the protection layer 22 provided in contact with the lower layer side (substrate 12 side) of the photoresist film 30 is removed. More specifically, in this development process, the development of the photoresist film 30 and etching of the protection layer 22 are simultaneously performed, i.e., in the same process, by the use of an alkaline developing liquid.

The development of the photoresist film 30 refers to treatment for leaving the region 30B that is not irradiated with light in the exposure process as the resist pattern 30B' by removing the alkali soluble region (region 30A irradiated with light) in the photoresist film 30 passing through the exposure process using an alkaline developing liquid as shown in (E) of FIG. 3.

When the photoresist film 30 is developed, the region 22A other than the region (protection layer 22B) continuously contacting the resist pattern 30B' of the protection layer 22 is exposed to the surface.

Here, the protection layer 22 is soluble in the alkaline developing liquid to be used in the development process as described above. Thus, when the region 22A exposed by removal of a part of the photoresist film 30 by the alkaline developing liquid is immersed in the alkaline developing liquid, the exposed region 22A is removed and only the protection layer 22B is left.

More specifically, by the use of the alkaline developing liquid, both the development of the photoresist film 30 ((E) of FIG. 3) and the etching ((F) of FIG. 3) of the protection layer 22 are performed in the development process, and thus the resist pattern 30B' is laminated on the protection layer 22B as the protection layer 22 after etching.

The alkaline developing liquid to be used in this development process may be any substance insofar as it is a solution capable of developing the photoresist film 30 and is a liquid capable of dissolving the protection layer 22. Specific examples of the alkaline developing liquid include an aqueous alkaline solution.

The aqueous alkaline solution is suitably selected from known developing liquids as appropriate, and examples include aqueous solutions containing sodium hydroxide, potassium hydroxide, sodium carbonate, sodium silicate, sodium metasilicate, aqueous ammonia, ethylamine, diethylamine, dimethylethanolamine, tetramethyl ammonium hydroxide, tetraethyl ammonium hydroxide, choline, pyrrole, piperidine, 1,8-diazabicyclo-[5.4.0]-7-undecene.

The alkaline developing liquid to be used in this development process is preferably an aqueous alkaline solution whose alkali concentration is adjusted so that the pH is 8 to 14, preferably 9 to 13, and more preferably 10 to 13.

Examples of development methods to be used in this development process include a dip method, a spray method, and a paddle method and the like. The development temperature is preferably set to be 15° C. to 40° C. After development, the resultant is generally washed with running water.

The dissolution rate of the protection layer 22 in the alkaline developing liquid to be used in the development process is preferably at least twice, more preferably at least 5 times, and particularly preferably at least 10 times the dissolution rate of the active layer 18 in the alkaline developing liquid.

When the dissolution rate of the protection layer 22 in the alkaline developing liquid is at least twice the dissolution rate of the active layer 18 in the alkaline developing liquid, etching of the active layer 18 is suppressed (i.e., a process margin becomes large) during etching of the protection layer 22 by the alkaline developing liquid in the development process, and the processing becomes easy.

The dissolution rate may be adjusted by selecting, as appropriate, the materials constituting the active layer 18 and the protection layer 22 according to the target manufacturing conditions.

$SiO_2$ generally used as a layer protecting the active layer 18 has properties of alkali resistance and acid resistance. Therefore, a layer containing $SiO_2$ is not etched by the alkaline developing liquid. Accordingly, when a layer containing $SiO_2$ is used in place of the protection layer 22 of the field-effect transistor 10 in this exemplary embodiment, it is substantially impossible to etch the layer containing $SiO_2$ in the development process described above. Therefore, when the layer containing $SiO_2$ is used in place of the protection layer 22 of the field-effect transistor 10 in this exemplary embodiment, simplification of the manufacturing process as in the invention is not achieved.

(6) Separation Process

The resist pattern 30B' is separated in a separation process. In detail, first, etching of the protection layer 22 is performed simultaneously with the development of the photoresist film 30 in the development process, and thus the resist pattern 30B' is separated from a laminate 10A ((G) of FIG. 3) in which the substrate 12, the gate electrode 14, the gate insulating film 16, the active layer 18, the protection layer 22B, and the resist pattern 30B' are laminated in this order. Methods for separating the resist pattern 30B' may be any method insofar as the resist pattern 30B' can be separated from the protection layer 22B, and a method for removing the resist pattern 30B' by dissolution, an ultrasonic wave, ashing or the like, are preferably used.

A separation liquid to be used in order to remove the resist pattern 30B' by dissolution may be a liquid that does not dissolve the active layer 18 and the protection layer 22B and can dissolve the resist pattern 30B' and may be selected as appropriate according to the materials constituting the active layer 18 and the protection layer 22B and the materials constituting resist pattern 30B'. In this exemplary embodiment, a neutral separation liquid is preferably used, for example, and, specifically, a solution containing N-methyl-2-pyrrolidone or the like is used.

(7) Active Layer Processing Process

In an active layer processing process, the active layer 18 is processed into a desired pattern. In detail, in the laminate (not shown) in which the resist pattern 30B' is separated in the separation process, a resist pattern 32 is formed in such a manner as to cover a portion of the upper surface of the active layer 18 and the upper surface and the side surfaces of the protection layer 22B as shown in (H) of FIG. 3. Methods for forming the resist pattern 32 may be the same forming method as in the resist pattern 30B'.

Next, as shown in (H) of FIG. 3, by etching the region 18A exposed from the resist pattern 32 of the active layer 18, the active layer 18 is processed to obtain the active layer 18B in which a region 18A is removed from the active layer 18.

As processing methods for the active layer 18, wet etching is preferably used. Since the active layer 18 is susceptible to acid, an acid etching liquid is used as an etching liquid to be used for the etching of the active layer 18. When the active layer 18 contains In—Ga—Zn—O, an oxalic acid mixed liquid is preferably used as the etching liquid.

The active layer 18 is etched to form the active layer 18B, and then the resist pattern 32 is separated. A separation liquid for the resist pattern 32 may be the same separation liquid as that used for the separation of the resist pattern 30W, for example.

(8) Source Electrode and Drain Electrode Forming Process

In a conductive layer forming process, the source electrode 20A and the drain electrode 20B are formed.

In the conductive layer forming process, a conductive layer 20 is first formed in such a manner as to cover both the active layer 18B formed by the active layer processing process and the protection layer 22B laminated on the active layer 18B. In detail, the conductive layer 20 is formed in such a manner as to cover the exposed regions (upper surface and side surfaces) of the active layer 18B and the exposed regions (upper surface and side surfaces) of the protection layer 22B ((I) of FIG. 4).

Forming methods for the conductive layer 20 are not particularly limited, and a method may be selected as appropriate from wet methods, such as a printing method or a coating method, physical methods, such as a vacuum deposition method, a sputtering method, or an ion plating method, and chemical methods, such as CVD or a plasma CVD method, etc., according to the materials to be selected as the conductive layer 20. For example, when ITO is selected as the conductive layer 20, a direct current or high frequency sputtering method, a vacuum deposition method, and an ion plating method are preferably used. When organic conductive compounds are used as the materials forming the conductive layer 20, the conductive layer 20 is preferably formed by a wet film forming method.

The formed conductive layer 20 functions as the source electrode 20A and the drain electrode 20B when constituted as the field-effect transistor 10. Therefore, the materials constituting the conductive layer 20 may be selected from the materials mentioned as the materials constituting the source electrode 20A and the drain electrode 20B.

Next, a resist pattern 34 is formed on the conductive layer 20 by a photolithography method ((J) of FIG. 4). The forming of the resist pattern 34 may be the same method as in the resist pattern 30B'.

As shown in (J) of FIG. 4 and (K) of FIG. 4, a region of the conductive layer 20 that is not protected by the resist pattern 32 is removed by wet etching using an etching liquid. Thus, the source electrode 20A and the drain electrode 20B are formed.

As the etching liquid to be used for forming the source electrode 20A and the drain electrode 20B, an etching liquid that dissolves the materials constituting the conductive layer 20 and does not dissolve the protection layer 22B functioning as an etching stopper may be used. As an etching liquid having such properties, an acid etching liquid is used. When the protection layer 22B contains $Ga_2O_3$, a mixed liquid of phosphoric acid, nitric acid, and acetic acid is preferably used as the etching liquid.

Thus, the source electrode 20A and the drain electrode 20B are formed as shown in (K) of FIG. 4.

The dissolution rate of the materials constituting this conductive layer 20 (the source electrode 20A and the drain electrode 20B) in the etching liquid to be used for forming the source electrode 20A and the drain electrode 20B is preferably at least twice and more preferably at least 3 times the dissolution rate of the protection layer 22B in the etching liquid.

When the dissolution rate of the materials constituting this conductive layer 20 (the source electrode 20A and the drain electrode 20B) in the etching liquid to be used for forming the source electrode 20A and the drain electrode 20B is at least twice the dissolution rate of the protection layer 22B in the etching liquid, etching of the protection layer 22B during forming the source electrode 20A and the drain electrode 20B by etching of the conductive layer 20 can be suppressed (i.e., a process margin becomes large), and the processing becomes easy.

By separating the resist pattern 34 formed on the source electrode 20A and the drain electrode 20B, the field-effect transistor 10 is formed as shown in (L) of FIG. 4 and FIG. 1.

As described above, according to the method for manufacturing the top contact field-effect transistor 10 of this exemplary embodiment, the protection layer 22 having acid resistance and alkali solubility is formed on the active layer 18 formed in the semiconductor layer forming process, and then the photoresist film is formed on the protection layer 22 and exposed in a pattern shape in the exposure process as described above.

Then, in the following development process, the photoresist film 30 passing through the exposure process is developed using an alkaline developing liquid to form the resist pattern 30B' and also the region 22A exposed from the resist pattern 30B' of the protection layer 22 is removed to etch the protection layer 22.

Therefore, the protection layer 22 having a function of protecting the active layer 18 is processed with the development of the photoresist film 30 by the alkaline developing liquid in the development process, simplification of the manufacturing process for the field-effect transistor 10 is achieved. Moreover, since the active layer 18B is protected by the protection layer 22B, erosion of a channel region of the active layer B is suppressed in a later process. Particularly during the manufacturing of the source electrode 20A and the drain electrode 20B, the protection layer 22B functions as an etching stopper, and thus erosion of the active layer 18B by an acid etching liquid to be used for forming the source electrode 20A and the drain electrode 20B in the source electrode and drain electrode forming process is suppressed.

Since the erosion of the active layer 18B in the manufacturing process is suppressed, it is considered that, when constituted as the field-effect transistor 10, influence on the active layer 18B caused by the open air is inhibited and a threshold value shift in which the threshold value as a voltage generating the minimum current value shifts (fluctuate) due to changes with time is improved as a result.

The field-effect transistor 10 manufactured in this exemplary embodiment is preferably used for image display devices using liquid crystals or EL devices, particularly for Flat Panel Displays (FPD). The field-effect transistor 10 manufactured in this exemplary embodiment is more preferably used for flexible display devices using flexible substrates, such as organic plastic films, for the substrate. The field-effect transistor 10 of this exemplary embodiment is particularly preferably used for the display devices using organic EL devices.

Also as in the case where the field-effect transistor 10 is applied to the display device, the simplification of the manufacturing process is achieved and the erosion of the active layer 18 in the manufacturing process is suppressed by similarly manufacturing the field-effect transistor 10 according to the manufacturing process described above.

EXAMPLES

Hereinafter, the field-effect transistor manufacturing method of the invention will be described with reference to Examples, but the invention is not limited to the Examples.

Example 1

Semiconductor Layer Forming Process

First, a laminate in which a gate electrode, a gate insulating film, and an active layer were laminated on a substrate was formed.

As the substrate, non-alkali glass (EAGLE 2000, trade name, manufactured by Corning, Inc.) was used.

Next, Mo was deposited at a thickness of 40 nm as a gate electrode on the substrate. Sputtering conditions were as follows.

Mo sputtering conditions: A DC magnetron sputtering device was used under the conditions of a DC power of 380 W and a sputtering gas flow rate Ar=12 sccm. Next, the gate electrode was patterned.

For the patterning of the gate electrode, a photolithography method and an etching method were used.

Furthermore, the following gate insulating film was formed on the gate electrode.

Gate insulating film: A gate insulating film was provided by forming $SiO_2$ into at 100 nm using an RF magnetron sputtering vacuum deposition method (Conditions: Target: $SiO_2$, Film forming temperature: 54° C., Sputtering gas: $Ar/O_2$=12/2 sccm, RF power: 400 W, Film forming pressure: 0.4 Pa). The gate insulating film $SiO_2$ was patterned using a shadow mask during sputtering.

On the gate insulating film, an active layer containing amorphous oxide semiconductors was formed. A method for forming the active layer was performed, on the formed gate insulating film using, as a target, a polycrystalline sintered compact having a composition of $InGaZnO_4$ by an RF magnetron sputtering vacuum deposition method under the conditions of an Ar flow rate of 97 sccm, an $O_2$ flow rate of 1.6 sccm, an RF power of 200 W, and a pressure of 0.38 Pa. The thickness was 50 nm.

—Protection Layer Forming Process—

Next, $Ga_2O_3$ was deposited at a thickness of 50 nm as a protection layer on the formed active layer. The sputtering conditions were as follows.

Sputtering conditions: $Ga_2O_3$ was used as the target and an RF magnetron sputtering device was used under the conditions of an RF power of 100 W, a sputtering gas flow Ar=12 sccm, and $O_2$=5.0 sccm.

The resistivity (volume resistivity) of the protection layer was measured using Hiresta-UP (trade name, manufactured by Mitsubishi Chemical, Inc., to be 20 M Ω·cm.

—Photoresist Forming Process, Exposure Process—

Next, a photoresist film was formed on the protection layer, and exposed in a pattern shape.

In detail, the photoresist film was formed by applying AZ5214-E (trade name, manufactured by AZ Electronic Materials Ltd.) as a photoresist by a spin coater. After forming the photoresist film, prebaking was performed at 90° C. for 15 minutes and pattern exposure was performed.

—Development Process—

In a development process, the resultant was immersed for 100 seconds in an AZ300MIF developer (trade name, manufactured by AZ Electronic Materials Ltd.) as an alkaline developing liquid.

Thus, the photoresist film formed on the protection layer was developed to form a resist pattern and also the region 22A exposed from the resist pattern of the protection layer provided at the lower layer side of the photoresist film was removed. Then, it was confirmed that the development of the photoresist film and the etching of the protection layer were simultaneously performed in the same process.

The dissolution rate of the protection layer in the alkaline developing liquid used in the development process was 2.5 nm/s and the dissolution rate of the active layer in the alkaline developing liquid was 0.2 nm/s or lower. Therefore, the dissolution rate of the protection layer in the alkaline developing liquid was at least 10 times the dissolution rate of the active layer in the alkaline developing liquid.

—Separation Process—

Next, the resist pattern was separated. The resist pattern was immersed in a separation liquid 104 (trade name, manufactured by Tokyo Ohka Kogyo Co., Ltd.) having a liquid temperature of 45° C. for 10 minutes.

—Active Layer Processing Process, Source Electrode and Drain Electrode Forming Process—

Next, on the active layer and the protection layer, a resist pattern was formed using AZ5214-E (trade name, manufactured by AZ Electronic Materials Ltd.) as a resist. The resist pattern was formed by applying the resist by a spin coater. After forming the resist film, baking was performed at 90° C. Next, exposure and development were performed to form a resist pattern, and then a region exposed from the resist pattern of the active layer was etched to process the active layer. As the etching conditions, an oxalic acid mixed liquid was used as an etching liquid at a liquid temperature of 45° C.

Furthermore, the resist pattern was separated using a separation liquid 104 (trade name, manufactured by Tokyo Ohka Kogyo Co., Ltd.) as a separation liquid, and then Mo was vapor-deposited at a thickness of 100 nm as a conductive layer. The sputtering conditions were as follows.

Mo sputtering conditions: A DC magnetron sputtering device was used under the conditions of a DC power of 380 W and a sputtering gas flow rate Ar=12 sccm.

Next, on the conductive layer, a resist pattern was formed using AZ5214-E (trade name, manufactured by AZ Electronic Materials Ltd.) as a resist. The resist pattern was formed by applying the resist by a spin coater. After forming the resist film, baking was performed at 90° C.

Next, exposure and development were performed to form a resist pattern, and then a region exposed from the resist pattern of the conductive layer was etched using a mixed liquid of phosphoric acid, nitric acid, and acetic acid having a liquid temperature of 23° C. as an etching liquid to process the conductive layer, thereby forming the source electrode and the drain electrode.

The dissolution rate of the conductive layer (the source electrode and the drain electrode) in a mixed liquid of phosphoric acid and nitric acid (liquid temperature of 23° C.) as an etching liquid used when processing the conductive layer to form the source electrode and the drain electrode was measured to be 6 nm/s. The dissolution rate of the protection layer in the etching liquid was 0.4 nm/s. Therefore, the dissolution rate of the conductive layer in the etching liquid was 15 times the dissolution rate of the protection layer in the etching liquid.

Thus, the field-effect transistor 1 having the configuration shown in FIG. 1 was produced.

Comparative Example 1

In Comparative Example 1, a layer containing $SiO_2$ (hereinafter referred to as a comparative layer) was formed in place of the protection layer. The processes were the same as in Example 1, except the forming and processing of the comparative layer.

A layer (50 nm) containing $SiO_2$ as the comparative layer was formed by a sputtering method. As the sputtering conditions, $SiO_2$ was used as a target and an RF magnetron sputtering device was used under the conditions of an RF power of 100 W, a sputtering gas flow rate Ar=12 sccm, and $O_2$=5.0 sccm.

The processing of the layer containing $SiO_2$ as the comparative layer was performed by the resist forming, exposure, development, etching, and separation and the etching process was performed using $CF_4$ gas by dry etching.

Thus, a comparative field-effect transistor 1 was produced.

—Evaluation—

As describe above, in the field-effect transistor 1 produced in Example 1, the processing of the protection layer was performed simultaneously with the development of the photoresist film in the development process for developing the photoresist film. Accordingly, the process can be further simplified compared with Comparative Example 1.

<On/OFF Ratio>

The ON/OFF ratio of each of the field-effect transistor 1 obtained in Example and the comparative field-effect transistor 1 obtained in Comparative Example was calculated by measuring the drain current-gate voltage properties when a fixed drain voltage was applied using a semiconductor parameter analyzer (4155C (trade name), manufactured by Agilent Technology). Then, the field-effect transistor 1 produced in Example 1 showed favorable transistor properties of an ON/OFF ratio=$10^7$ and, in contrast, in the comparative field-effect transistor 1 produced in Comparative Example 1, the OFF current was very large and the OFF operation was not achieved. It is considered that a stable transistor operation can be achieved because damages to the active layer during forming the protection layer film were reduced in Example 1 compared with Comparative Example 1.

Considering the above respects, it can be said that the manufacturing process was simplified in the field-effect transistor manufacturing process according to the manufacturing method of Example 1, compared with Comparative Example 1.

The invention includes the following embodiments.

(1) A method of manufacturing a top contact field-effect transistor comprising a substrate, a gate electrode, a gate insulating film, an active layer comprising an oxide semiconductor as a main component, a protection layer, a source electrode, and a drain electrode, the method comprising:
 forming the protection layer on the active layer,
 forming a photoresist film on the protection layer,
 pattern exposing the photoresist film, and
 developing the photoresist film using an alkaline developing liquid to form a resist pattern, and removing a region exposed by the resist pattern from the protection layer.

(2) The method of manufacturing the field-effect transistor according to (1), wherein the dissolution rate of the protection layer in the alkaline developing liquid is at least twice the dissolution rate of the active layer in the alkaline developing liquid.

(3) The method of manufacturing the field-effect transistor according to (1), wherein the protection layer comprising an oxide that comprises Ga.

(4) The method of manufacturing the field-effect transistor according to (1), wherein the protection layer is amorphous.

(5) The method of manufacturing the field-effect transistor according to (1), wherein the protection layer is formed by sputtering.

(6) The method of manufacturing the field-effect transistor according to (1), wherein the active layer comprises at least one element selected from the group consisting of In, Zn, and Ga.

(7) The method of manufacturing the field-effect transistor according to (1), wherein the active layer is formed by sputtering.

(8) The method of manufacturing the field-effect transistor according to (1), wherein the layer thickness of the protection layer is from 20 nm to 500 nm.

(9) The method of manufacturing the field-effect transistor according to (1), wherein the resistivity of the protection layer is from 100Ω·cm to 100 GΩ·cm.

(10) The method of manufacturing the field-effect transistor according to (1), wherein the dissolution rate of the source electrode and the drain electrode in an etching liquid used for forming the source electrode and the drain electrode is at least twice the dissolution rate of the protection layer in the etching liquid.

(11) The method of manufacturing the field-effect transistor according to (1), wherein the substrate contains an organic plastic film.

(12) A field-effect transistor manufactured according to the method of manufacturing the field-effect transistor according to any one of (1) to (11).

(13) A method of manufacturing a display device containing a field-effect transistor, the method comprising manufacturing a field-effect transistor by the method of manufacturing the field-effect transistor according to any one of (1) to (11).

All publications, patent applications, and technical standards mentioned in this specification are herein incorporated by reference to the same extent as if each individual publication, patent application, or technical standard was specifically and individually indicated to be incorporated by reference.

What is claimed is:

1. A method of manufacturing a top contact field-effect transistor comprising a substrate, a gate electrode, a gate insulating film, an active layer comprising an oxide semiconductor as a main component, a protection layer, a source electrode, and a drain electrode, the method comprising:
forming the protection layer on the active layer,
forming a photoresist film on the protection layer,
pattern exposing the photoresist film, and
developing the photoresist film using an alkaline developing liquid to form a resist pattern, and removing a region exposed by the resist pattern from the protection layer, wherein the dissolution rate of the protection layer in the alkaline developing liquid is at least twice the dissolution rate of the active layer in the alkaline developing liquid.

2. The method of manufacturing the field-effect transistor according to claim 1, wherein the protection layer comprising an oxide that comprises Ga.

3. The method of manufacturing the field-effect transistor according to claim 1, wherein the protection layer is amorphous.

4. The method of manufacturing the field-effect transistor according to claim 1, wherein the protection layer is formed by sputtering.

5. The method of manufacturing the field-effect transistor according to claim 1, wherein the active layer comprises at least one element selected from the group consisting of In, Zn, and Ga.

6. The method of manufacturing the field-effect transistor according to claim 1, wherein the active layer is formed by sputtering.

7. The method of manufacturing the field-effect transistor according to claim 1, wherein the layer thickness of the protection layer is from 20 nm to 500 nm.

8. The method of manufacturing the field-effect transistor according to claim 1, wherein the resistivity of the protection layer is from 100 Ω·cm to 100 GΩ·cm.

9. The method of manufacturing the field-effect transistor according to claim 1, wherein the dissolution rate of the source electrode and the drain electrode in an etching liquid used for forming the source electrode and the drain electrode is at least twice the dissolution rate of the protection layer in the etching liquid.

10. The method of manufacturing the field-effect transistor according to claim 1, wherein the substrate contains an organic plastic film.

11. A field-effect transistor manufactured according to the method of manufacturing the field-effect transistor according to claim 1.

12. A method of manufacturing a display device containing a field-effect transistor, the method comprising manufacturing a field-effect transistor by the method of manufacturing the field-effect transistor according to claim 1.

* * * * *